United States Patent [19]

Hayakawa et al.

[11] Patent Number: 4,567,060
[45] Date of Patent: Jan. 28, 1986

[54] METHOD OF PRODUCING A SEMICONDUCTOR LASER DEVICE

[75] Inventors: Toshiro Hayakawa, Nara; Takahiro Suyama, Tenri; Saburo Yamamoto, Nara, all of Japan

[73] Assignee: Sharp Kabushiki Kaisha, Osaka, Japan

[21] Appl. No.: 671,951

[22] Filed: Nov. 16, 1984

[30] Foreign Application Priority Data

Nov. 18, 1983 [JP] Japan ................. 58-218276

[51] Int. Cl.[4] ............................. H01L 7/00
[52] U.S. Cl. .......................... 427/87; 29/569 L;
148/171; 148/175; 148/DIG. 50; 148/DIG. 95;
372/46
[58] Field of Search .............. 29/569 L; 427/87;
372/45, 46; 148/171, 175, DIG. 50, DIG. 95

[56] References Cited

U.S. PATENT DOCUMENTS 4,269,635  5/1981  Logan et al. ............... 29/569 L
4,355,396 10/1982  Hawrylo .................... 29/569 L
4,371,968  2/1983  Trussell et al. ............ 29/569 L
4,480,331 10/1984  Thompson .................. 148/171

Primary Examiner—John H. Newsome
Attorney, Agent, or Firm—Birch, Stewart, Kolasch & Birch

[57] ABSTRACT

A method of producing a semiconductor laser device, comprising depositing a first cladding layer, an active layer, and a second cladding layer successively, which three layers having heterojunctions each between neighboring two layers, said first and second cladding layers being made of mixed crystals of a semiconductor material composing the active layer and another semiconductor material containing aluminum, depositing a fourth thin semiconductor layer on the second cladding layer, said fourth layer being made of material not including aluminum, and having charge carriers of the same type with that of the second cladding layer, depositing a fifth semiconductor layer on said fourth layer, said fifth semiconductor layer having charge carriers of the type opposite to that of the second cladding layer, forming a stripe-like groove by etching in said fifth semiconductor layer down to said fourth semiconductor layer, and depositing a sixth semiconductor layer on said fifth semiconductor layer and on said groove, said sixth layer having charge carriers of the same type with that of the second cladding layer.

10 Claims, 6 Drawing Figures

METHOD OF PRODUCING A SEMICONDUCTOR LASER DEVICE

FIELD OF THE INVENTION

This invention relates to a method of producing a semiconductor laser device and more particularly a method of producing of a semiconductor laser whose structure is effective to control the transverse mode of the laser oscillation and to reduce the threshold current by using new crystal growth techniques such as the molecular beam epitaxy process (MBE) and the metal-organic chemical vapor deposition process (MOCVD).

DESCRIPTION OF PRIOR ART

Recently, the crystal growth technique of thin film single crystal has developed remarkably, and new techniques such as MBE and MOCVD enable us to grow an epitaxial layer as thin as about 10 Å.

As for a semiconductor laser device, the liquid phase epitaxy process (LPE) has been used generally. However, new techniques such as MBE and MOCVD allow us to grow a very thin layer which is difficult to be realized with the prior art technique LPE. New types of semiconductor laser device showing new effects owing to the thinness of the layer have been developed recentry. For example, a quantum well laser makes use of the quantized levels formed in a very thin active layer: See, for example, W. T. Tsang, Phys. Lett. 39, 786(1981); N. K. Dutta, J. Appl. Phys. 153, 7211(1982); and H. Iwamura, T. Saku, T. Ishibashi, K. Otsuka, and Y. Horikoshi, Electronics Lett., 19, 180(1983).

On the other hand, new techniques such as MBE and MOCVD can also be used to improve the prevalent type of a semiconductor laser device. The stabilization of the transverse mode has been an important factor for practical use of a semiconductor laser. This invention concerns with the improvement of the stabilization of the transverse mode by making use of the new crystal growth techniques.

In an early type of a stripe semiconductor laser wherein the electric current is limited with a stripe electrode, the transverse mode is unstable and has the current dependency. The zeroth or fundamental transverse mode of the laser oscillation appears only in a region just a little above the threshold current with increase in the drive current because the gain for the oscillation overcomes the loss only in a part of the active layer just near the stripe. With further increase in the drive current, however, the carriers injected into the active layer spread gradually to both sides of the abovementioned part of the active layer, that is, the high gain region broadens, so that the transverse mode of the laser oscillation broadens and the higher order transverse modes are generated. Such unstability of the transverse mode gives rise to many problems to be solved for practical use of a semiconductor laser. For example, the linearity between the drive current and the output is lost with increase in the driving current. Then, when a laser device is modulated with the pulse current, the unstable modulation of the output arises and the signal-to-noise ratio decreases. The directivity of the output light becomes unstable so that it makes difficult to guide the output light effectively and stably to an optical system such as an optical fiber.

Many structures of a semiconductor laser of the GaAlAs system and of the InGaAsP system have been proposed in order to stabilize the transverse mode by confining not only the current but also the light in the transverse direction. Most of the structures can be produced only by using a special characteristic of the liquid phase epitaxy process (LPE), that is, by using the anisotropy of the growth rate of an epitaxial layer applied on a substrate having a groove, a mesa or a step. Representatives of the structures are as follows: a CSP laser (K. Aiki, M. Nakamura, T. Kuroda and J. Umeda, Appl. Phys. Lett. 30, 649(1977)); a CDH laser (D. Botez, Appl. Phys. Lett. 33, 872(1978)); and a TS laser (T. Sugino, M. Wada, H. Shimizu, K. Itoh and I. Teramoto, Appl. Phys. Lett. 34, 270(1979)). Those lasers cannot be produced by using crystal growth techniques such as MBE and MOCVD.

FIG. 1 shows a cross-sectional view of a V-channeled substrate inner stripe (VSIS) laser produced by making use of LPE (S. Yamamoto, H. Hayashi, S. Yano, T. Sakurai and T. Hijikata, Appl. Phys. Lett. 40, 372(1982)), as an example of a laser wherein the transverse mode is stabilized. After an n-GaAs current blocking layer 2 is grown on a p-GaAs substrate 1, a V-shaped groove 9 is formed with chemical etching down to the substrate 1. Then, a p-GaAlAs cladding layer 3, a GaAlAs active layer 4, an n-GaAlAs cladding layer 5, and an n-GaAs cap layer 6 are grown successively, to form a multi-layer crystal structure of double-heterojunction (DH) type for the laser excitation, and thereafter electrodes 7, 8 are applied on the lower and upper side respectively. In this structure, the p-GaAlAs cladding layer 3 is grown rapidly over the V-groove 9 owing to the anisotropy of the growth rate so that the active layer 4 can be grown planely. Therefore, the active layer 4 and the double heterojunction between layers 3,4,5 become flat. In the structure, the inner stripe in the groove confines the driving current, and the double heterojunction confines the laser oscillation. A semiconductor laser device of this type can generate the output power up to more than 20 mW while the laser oscillation is kept in the fundamental transverse mode because the transverse mode in the flat active layer 4 is stabilized owing to the absorption of the laser light outside the V-groove 9 by the current blocking layer 2.

Most of the abovementioned structures proposed in order to stabilize the transverse mode cannot be produced with new crystal growth techniques such as MBE and MOCVD. FIG. 2 shows the cross-sectional view of a device produced by making use of MOCVD. This device has a structure similar to that shown in FIG. 1. After an n-GaAs current blocking layer 2 is grown on a p-GaAs substrate 1, a V-shaped groove 9 is formed with the chemical etching down to the substrate 1, and thereafter, a p-GaAlAs cladding layer 3, a GaAlAs active layer 4, an n-GaAlAs cladding layer 5 and an n-GaAs cap layer 6 are grown by using MOCVD. On the growth of the p-GaAlAs cladding layer 3, the layer 3 is not grown to bury the V-groove 9 fully owing to the small anisotropy of the growth rate in MOCVD so that the active layer 4 also is grown curved in the V-groove 9 contrary to that shown in FIG. 1. The curved active layer 4 causes following disadvantages. First, the distribution of the effective index of refraction of the layers 3,4,5 forming the light guide channel varies largely around the V-shape of the active layer 4 so that the laser light is guided strongly to the top of the V-shape, and therefore higher order transverse modes are liable to oscillate. Second, since the diameter of the spot wherein the laser light oscillates becomes small, the density of the light is enhanced, and the light output saturates easily, so that it is hard to obtain a high output power.

Such disadvantages arise generally when a DH type of multi-layer crystal structure is produced by usuing MBE or MOCVD on a substrate having a groove, mesa or a step because the crystal layers are grown resembling to the shape of the substrate.

SUMMARY OF THE INVENTION

It is an object of the present invention to provide a method of producing a semiconductor laser device wherein the transverse mode is stabilized, even when new techniques such as MBE or MOCVD are used.

A method of producing a semiconductor laser device according to the present invention comprises (1) depositing a first cladding layer, an active layer, and a second cladding layer successively, which three layers having heterojunctions each between neighboring two layers, said first and second cladding layers being made of mixed crystals of a semiconductor material composing the active layer and another semiconductor material containing aluminum, (2) depositing a fourth thin semiconductor layer on the second cladding layer, said fourth layer being made of material not including aluminum, and having charge carriers of the same type with that of the second cladding layer, (3) depositing a fifth semiconductor layer on said fourth layer, said fifth semiconductor layer having charge carriers of the type opposite to that of the second cladding layer, (4) forming a stripe-like groove by etching in said fifth semiconductor layer down to said fourth semiconductor layer, and (5) depositing a sixth semiconductor layer on said fifth semiconductor layer and on said groove, said sixth layer having charge carriers of the same type with that of the second cladding layer.

An advantage of the present invention is to provide a semiconductor laser device which can be produced by using new crystal growth techniques such as MBE and MOCVD.

These techniques enable us to form layers including an active layer as thin as possible so that many properties can be improved besides the stabilization of the transverse mode of the laser oscillation. For example, the value of the threshold current can be lowered.

BRIEF DESCRIPTION OF THE DRAWINGS

An embodiment of the invention will now be described by way of examples and with reference to the accompanying drawings, in which.

EMBODIMENTS

Figure 1:
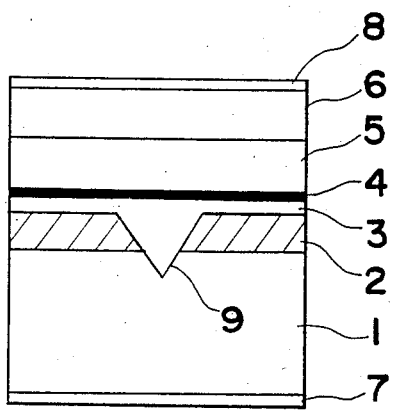
FIG. 1 is a schematic cross-sectional view of a prior-art semiconductor laser produced by making use of LPE.
Figure 2:
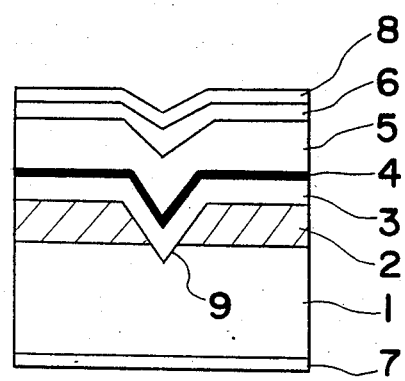
FIG. 2 is a schematic cross-sectional view of a prior-art semiconductor laser produced by making use of MOCVD.
Figure 3:
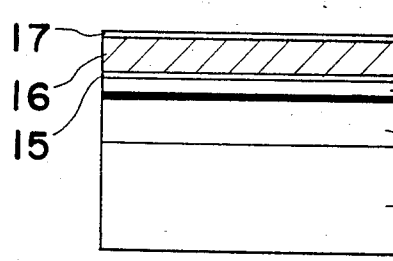
FIG. 3, FIG. 4 and FIG. 5 are a schematic cross-sectional view of a semiconductor laser device of an embodiment according to the invention at the three stages of the production.
Figure 4:
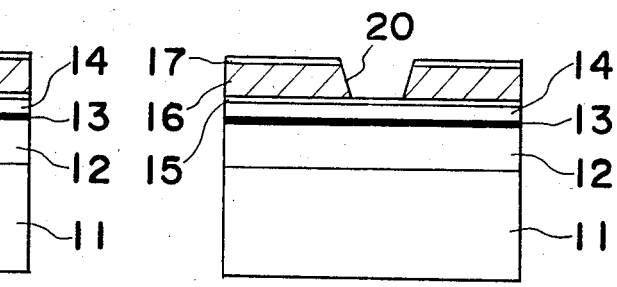
Figure 5:
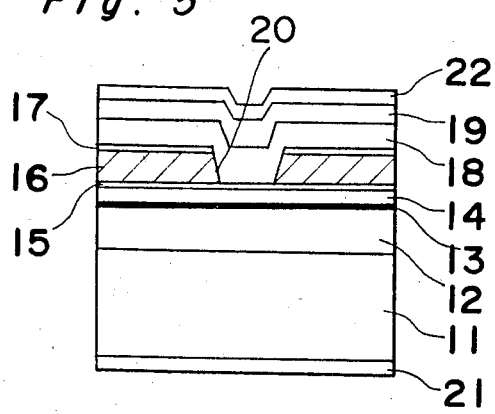

FIGS. 3-5 show three stages of an embodiment according to the invention in series. First, as shown in FIG. 3, following layers are grown successively by using MBE on an n-GaAs substrate 11: an n-$Ga_{0.55}Al_{0.45}As$ cladding layer 12 of thickness 1 micrometer, an undoped $Ga_{0.85}Al_{0.15}As$ active layer 13 of thickness 0.05 micrometer, an p-$Ga_{0.55}Al_{0.45}As$ cladding layer 14 of thickness 0.1 micrometer, a p-GaAs oxidation inhibiting layer 15 of thickness 0.005 micrometer, a n-$Ga_{0.3}Al_{0.7}As$ current blocking layer 16 of thickness 0.8 micrometer and an n-GaAs oxidation inhibiting layer 17 of thickness 0.005 micrometer. A multilayer structure consisting of three layers 12, 13 and 14 has double heterojunctions between neighboring layers. Then, as shown in FIG. 4, a stripe groove 20 is formed by using a photolithography process down through the oxidation inhibiting layer 17 and the current blocking layer 16 to the oxidation inhibiting layer 15. On this process, a region of the n-GaAs oxidation inhibiting layer 17 to be removed is etched with an etchant ($H_2O_2$:$NH_4OH$=5:1) which etches GaAs selectively, and next a region of the n-$Ga_{0.3}Al_{0.7}As$ current blocking layer 16 to be removed is etched selectively with flouric acid in such a way that the etching is stopped just at the surface of oxidation inhibiting layer 15. Such a procedure prevents the deterioration of the crystallinity of a cladding layer 18 to be formed in the next process and of the interface between the cladding layer 18 and the current blocking layer 16, because the current blocking layer 16 which is liable to be oxidized due to its constituent aluminum is not exposed except the side surface of the groove 20. Next, as shown in FIG. 5, a p-$Ga_{0.55}Al_{0.45}As$ cladding layer 18 and a p-GaAs cap layer 19 is grown successively by using MBE. Then, electrodes 21 and 22 are each formed on the both surfaces of the laser device, respectively. Thus, the production of a semiconductor laser device is completed.

During the excitation of a laser device, the oscillation region of the active layer 13 is filled with both current and light of high density, and if defects exist near the active layer 13, defects increases to cause the deterioration of a laser device. Therefore, the existence of the oxidation inhibiting layer 15 near the active layer 13 is especially important in order to prevent the deterioration of the crystallinity near the active layer 13 so as to improve the reliability of the laser device.

The current blocking layer 16 serves not only to inject the current in the active layer 13 through the groove 20 effectively, but also to form such a distribution of the refractive index as to guide the laser light in the active layer region just under the groove 20 and therefore, to stabilize the transverse mode. The distribution of the refractive index of a multi-layer structure of the DH type can be controlled precisely by controlling the thickness of the layer 14 or by varying the mixing ratio of the aluminum to be contained in the layer 18. Since the thickness of each layer can be controlled precisely by making use of MBE, devices having equal quality wherein the transverse mode is stabilized can be produced.

Figure 6:
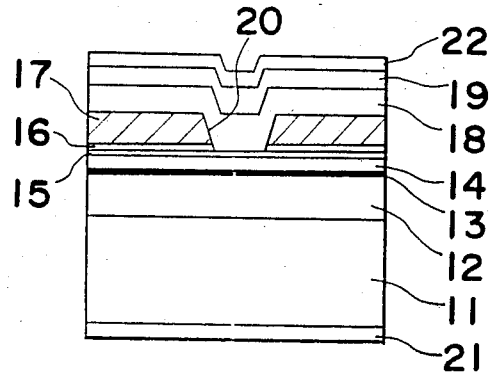
FIG. 6 is a schematic cross-sectional view of another embodiment according to the invention.

FIG. 6 shows a schematic cross-sectional view of a second embodiment according to the present invention. The structure of the second embodiment shown in FIG. 6 differs from that of the first embodiment shown in FIG. 5 only in the thicknesses of layers 16, 17. An n-$Ga_{0.3}Al_{0.7}As$ layer 16 as an etch stopping layer is made as thin as 0.005 micrometer, while an n-GaAs layer 17 as a current blocking layer is made as thick as 0.8 micrometer. In the second embodiment, the oscillation of the higher transverse modes can be suppressed effectively because the laser light is absorbed in the n-GaAs layer 17 except near the groove 20. The deterioration of the crystallinity is less because the current blocking layer 16 containing aluminum is exposed little on the growth of the layer 18.

In both embodiments mentioned above, it is also possible to grow the GaAlAs cladding layer 18 by making of LPE because the GaAlAs layer 16 is exposed little. In the first embodiment, it is possible to grow the cladding layer 18 directly on the $Ga_{0.3}Al_{0.7}As$ current blocking layer 16 by using MBE or MOCVD, without growing the GaAs layer 17. Though the growth of the cladding layer 18 with MBE or MOCVD is possible even if the oxidation inhibiting layer 15 does not exist, this is not appropriate as for the reliability of the device because of the deterioration of the crystallinity.

In the present embodiments, the insertion of the oxidation inhibiting layer 15 above the cladding layer 14 serves to suppress the deterioration of the crystallinity around the groove 20 on the growth of the cladding layer 18. The thickness of the oxidation inhibiting layer 15 should be so thin below about 100 Å as not to affect optical properties of the device.

As mentioned above, both embodiments according to the present invention relates to a GaAlAs semiconductor laser and can produce the laser device by using MBE. However, it is also possible to grow them by using MOCVD or by using LPE partly. Furthermore, the crystal growth techniques which can be used to produce a device according to the invention is not limited to those mentioned above. It is also possible to produce a semiconductor laser device by arranging semiconductor mixed crystals such as InGaAlP, and InGaAsP besides GaAlAs as mentioned above.

Furthermore, it is apparent that the characteristics of a device can be improved more by providing a quantum well structure in the active layer region.

This invention may be practiced or embodied in still other ways without departing from the spirit or essential character thereof. The preferred embodiments described herein are therefore illustrative and not restrictive, the scope of the invention is being indicated by the appended claims and all variations which comes within the meaning of the claims are intended to be embraced therein.

We claim:

1. A method of producing a semiconductor laser device, comprising depositing a first cladding layer, an active layer, and a second cladding layer successively, which three layers having heterojunctions each between neighboring two layers, said first and second cladding layers being made of mixed crystals of a semiconductor material composing the active layer and another semiconductor material containing aluminum, depositing a fourth thin semiconductor layer on the second cladding layer, said fourth layer being made of material not including aluminum, and having charge carriers of the same type with that of the second cladding layer, depositing a fifth semiconductor layer on said fourth layer, said fifth semiconductor layer having charge carriers of the type opposite to that of the second cladding layer, forming a stripe-like groove by etching in said fifth semiconductor layer down to said fourth semiconductor layer, and depositing a sixth semiconductor layer on said fifth semiconductor layer and on said groove, said sixth layer having charge carriers of the same type with that of the second cladding layer.

2. A method of producing a semiconductor laser device according to claim 1, wherein the thickness of said fourth layer is below about 100 Å.

3. A method of producing a semiconductor laser device according to claim 1, wherein said sixth layer is deposited with the molecular beam epitaxy process.

4. A method of producing a semiconductor laser device according to claim 1, wherein said sixth layer is deposited with the metal-organic chemical vapor deposition process.

5. A method of producing a semiconductor laser device according to claim 1, wherein said layer first cladding layer, said active layer and said second cladding layer are deposited with the molecular beam epitaxy process.

6. A method of producing a semiconductor laser device according to claim 1, wherein said first cladding layer, said active layer and said second cladding layer are deposited with the metal-organic chemical vapor deposition process.

7. A method of producing a semiconductor laser device according to claim 1, wherein said step of depositing a fifth semiconductor layer consists of depositing successively a mixed crystal layer containing aluminum and a crystal layer not containing aluminum.

8. A method of producing a semiconductor laser device according to claim 7, wherein said crystal layer is thick enough to absorb the laser light from said active layer.

9. A method of producing a semiconductor laser device according to claim 7, wherein said mixed crystal layer is thin.

10. A method of producing a semiconductor laser device according to claim 7, wherein said sixth layer is deposited with the liquid phase epitaxy process.

* * * * *